(12) United States Patent
Kim

(10) Patent No.: US 7,746,128 B2
(45) Date of Patent: Jun. 29, 2010

(54) CLOCK MULTIPLIER AND CLOCK GENERATOR HAVING THE SAME

(75) Inventor: Woo-Seok Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 283 days.

(21) Appl. No.: 11/838,952

(22) Filed: Aug. 15, 2007

(65) Prior Publication Data

US 2008/0297210 A1 Dec. 4, 2008

(30) Foreign Application Priority Data

Aug. 21, 2006 (KR) ............ 10-2006-0078957

(51) Int. Cl.
*H03B 19/00* (2006.01)
(52) U.S. Cl. .......................... 327/116; 327/170
(58) Field of Classification Search ............ 327/116, 327/170–175
See application file for complete search history.

(56) References Cited

U.S. PATENT DOCUMENTS

| | | | | |
|---|---|---|---|---|
| 5,696,468 | A * | 12/1997 | Nise | 331/14 |
| 5,818,270 | A * | 10/1998 | Hamza | 327/116 |
| 5,952,891 | A * | 9/1999 | Boudry | 331/57 |
| 6,420,921 | B1 * | 7/2002 | Okayasu et al. | 327/276 |
| 6,661,267 | B2 * | 12/2003 | Walker et al. | 327/159 |
| 6,747,489 | B2 * | 6/2004 | Nasu | 327/116 |
| 6,967,514 | B2 * | 11/2005 | Kizer et al. | 327/175 |
| 7,184,509 | B2 * | 2/2007 | Cho et al. | 375/373 |
| 7,236,557 | B1 * | 6/2007 | Nguyen | 377/47 |
| 7,298,173 | B1 * | 11/2007 | Jiang et al. | 326/83 |
| 7,492,850 | B2 * | 2/2009 | Menolfi et al. | 375/376 |
| 7,548,100 | B2 * | 6/2009 | Cho et al. | 327/175 |
| 7,579,873 | B1 * | 8/2009 | Jiang et al. | 326/83 |
| 7,579,889 | B2 * | 8/2009 | Yang et al. | 327/158 |
| 2006/0119442 | A1 * | 6/2006 | Azam et al. | 331/16 |
| 2008/0260087 | A1 * | 10/2008 | Liang et al. | 375/376 |
| 2008/0292040 | A1 * | 11/2008 | Menolfi et al. | 375/376 |
| 2008/0315926 | A1 * | 12/2008 | Yoo | 327/157 |
| 2009/0091362 | A1 * | 4/2009 | Pellerano et al. | 327/158 |
| 2009/0168942 | A1 * | 7/2009 | Choi et al. | 375/373 |
| 2009/0195283 | A1 * | 8/2009 | Cho et al. | 327/175 |
| 2009/0206936 | A1 * | 8/2009 | Fernandez et al. | 331/8 |

FOREIGN PATENT DOCUMENTS

| | | |
|---|---|---|
| JP | 2000-049595 | 2/2000 |
| KR | 0305493 | 7/2001 |
| KR | 10-0541129 | 12/2005 |

* cited by examiner

*Primary Examiner*—Lincoln Donovan
*Assistant Examiner*—Adam D Houston
(74) *Attorney, Agent, or Firm*—F.Chau & Associates, LLC

(57) ABSTRACT

A clock multiplier includes a phase-frequency detector, a voltage-current converter, a duty ratio control circuit, a plurality of variable delay cells and an edge combiner. The phase-frequency detector generates control signals. The voltage-current converter converts the control signals to generate first and second current control voltages. The duty ratio control circuit modifies the duty ratio of an input clock signal based on the first and second current control voltages. Each of the variable delay cells generates a triangular wave voltage based on the modified input signal, generates a square wave voltage based on the triangular wave voltage to generate a delay signal. The edge combiner generates a plurality of multiplied clocks based on the delay signals from the variable delay cells.

13 Claims, 6 Drawing Sheets

CLOCK MULTIPLIER AND CLOCK GENERATOR HAVING THE SAME

CROSS-REFERENCE TO RELATED APPLICATIONS

This application claims priority, under 35 USC § 119, of Korean Patent Application No. 2006-78957 filed on Aug. 21, 2006 in the Korean Intellectual Property Office (KIPO), which is incorporated by reference herein in its entirety.

BACKGROUND OF THE INVENTION

1. Field of the Invention

The present invention relates to multiplication of a clock frequency, and more particularly to a clock multiplier capable of efficiently operating in a low frequency region and a clock generator including the clock multiplier.

2. Description of the Related Art

Generally, a clock multiplier in an integrated circuit generates internal clocks used for the inner circuits of the integrated circuit by multiplying the frequency of an input clock signal. Thus, although an input clock having a relatively low frequency is inputted to the integrated circuit, the clock multiplier can generate a clock having a relatively high frequency desirable to the integrated circuit.

A conventional clock multiplier typically includes a phase locked loop (PLL) or a delay locked loop (DLL).

Generally, a clock multiplier using the PLL detects a phase/frequency difference between division clocks (FIN/N, FOUT/N) corresponding to clocks divided frequencies of an input clock (FIN) and an output clock (FOUT) by N, and the clock multiplier using the PLL controls the frequency of the output clock (FOUT) based on the result of the detection.

However, the clock multiplier using the PLL requires a specific time for controlling the phase/frequency difference of the input clock and the output clock, and an error of the clock multiplier may be accumulated until the error is compensated with respect to the next input clock. When the frequency of an input clock of the clock multiplier using the PLL is about several tens of KHz, an error of the clock multiplier may accumulate more.

Generally, a clock multiplier using the DLL detects a phase/frequency difference between an input clock (FIN) and an output clock (FOUT), and controls the delay of a plurality of delay cells included in a delay line based on the result of the detection.

However, when a multiplication ratio is increased, a problem may occur such that the phase/frequency difference is increased among delay signals outputted from the delay cells. When the multiplication ratio is decreased, the phase/frequency difference is decreased among delay signals outputted from the delay cells. Thus, the clock multiplier using the DLL also does not efficiently operate in the low frequency region.

For example, when a clock multiplier receives an input clock having a period of 8 μs and generates an output clock having a period of 1 μs, the clock multiplier is required to include 16 delay cells each having a delay time of 8/16 μs. However, it is difficult to obtain a delay time of 0.5 μs with a conventional current starved delay cell. In current starved delay cells, a p-bias (gate bias to a PMOS device) is generated by a current mirror (a PMOS transistor connected as a MOS diode). A current-starved delay cell has two inverter stages, a voltage-controlled positive-channel metal oxide semiconductor (PMOS) current source and a voltage-controlled negative-channel metal oxide semiconductor (NMOS) current source (see FIG. 2). The two sources control the delay period of the delay cell.

SUMMARY OF THE INVENTION

Some exemplary embodiments of the present invention provide a clock multiplier and a method of multiplying a clock capable of efficiently operating in a low frequency region.

Some exemplary embodiments of the present invention provide a clock generator including a clock multiplier capable of efficiently operating in a low frequency region.

In some exemplary embodiments of the present invention, a clock multiplier includes a phase-frequency detector, a voltage-current converter, a duty ratio control circuit, a plurality of variable delay cells and an edge combiner.

Each variable delay cell comprises: an inverter including a pull-up circuit connected between a supply voltage and the inverter's output, and a pull-down circuit connected between a ground voltage and the inverter's output; a capacitor connected to the inverter's output; and a hysteresis buffer connected to the inverter's output.

Each pull-up circuit includes: a first switch controlled by the inverter's input and a first variable resistance device controlled by a first current control voltage and connected in series with the first switch. Each pull-down circuit includes: a second switch (inversely) controlled by the inverter's input and a second variable resistance device controlled by a second current control voltage and connected in series with the second switch. The first and second current control voltages may be generated based upon the control signals output by a phase-frequency detector, to control the amount of time required to charge and discharge the capacitor.

The hysteresis buffer is configured to generate a square wave voltage at a first logic level while the voltage at the output of the inverter is greater than a first critical value and configured to generate the square wave voltage at a second logic level while the voltage at the output of the inverter is less than a second critical value. The critical values may be controlled or predetermined so as to make the duty ratio of the delay signals output by each delay cell proportional (e.g., equal to) the duty cycle of the input clock signal.

The voltage-current converter converts a control voltage to generate first and second current control voltages. The control voltage is generated based on control signals of the phase-frequency detector. The duty ratio control circuit controls the duty ratio of an input clock signal based on the first and second current control voltages. Each of the variable delay cells generates a triangular wave voltage based on the modified input signal, generates a square wave voltage based on the triangular wave voltage to modify the delay of the modified input signal, and modifies again the duty ratio of the modified input signal to generate a delay signal. The triangular wave voltage has a slope corresponding to the first and second current control voltages, and the delay signal has its duty ratio proportional to the duty ratio of the input clock signal. The edge combiner generates a plurality of multiplied clocks based on the delay signals from the variable delay cells. The edge combiner may be a conventional edge combiner comprising combinatorial logic, including OR-gates, NOR-gates and inverters.

Each of the variable delay cells may include a capacitor, and the variable delay cell charges the capacitor through a first variable resistance device controlled by the first current control voltage while the modified input signal corresponds to a first logic level and discharges the capacitor through a second variable resistance device controlled by the second current control voltage while the modified input signal corresponds to a second logic level to generate the triangular wave voltage.

Each of the variable delay cells may further include a hysteresis buffer, and the hysteresis buffer generates the square wave voltage having the first logic level while the triangular wave voltage is greater than a first critical value and generates the square wave voltage having the second logic level while the triangular wave voltage is less than a second critical value.

The square wave voltage may correspond to a delay signal having its duty ratio proportional to the duty ratio of the input clock signal.

Each of the variable delay cells may include a capacitor, a first switch, a pull-up current circuit and a hysteresis buffer. The first switch is turned ON while the modified input signal corresponds to a first logic level. The pull-up current circuit charges the capacitor based on (through a first variable resistance device controlled by) the first current control voltage while the first switch is turned ON. The hysteresis buffer receives the triangular wave voltage and generates the delayed input clock signal having the first logic level while the triangular wave voltage is greater than a first critical value.

Each of the variable delay cells may further include a second switch and a pull-down current circuit. The second switch is turned ON while the modified input signal corresponds to a second logic level. The pull-down current circuit discharges the capacitor based on (through a second variable resistance device controlled by) the second current control voltage while the second switch is turned ON. The hysteresis buffer receives the triangular wave voltage and generates the delayed input clock signal having the second logic level while the triangular wave voltage is less than a second critical value.

The duty ratio control circuit generates an internal logic signal based on the first and second current control voltages and performs a logical OR operation upon the input clock signal and the internal logic signal so as to modify the duty ratio of the input clock signal.

The duty ratio control circuit includes a capacitor, and the duty ratio control circuit charges the capacitor through a first variable resistance device controlled by the first current control voltage while the input clock signal corresponds to a first logic level, discharges the capacitor through a second variable resistance device controlled by the second current control voltage while the input clock signal corresponds to a second logic level to generate the internal logic signal, and performs a logical OR operation upon the internal logic signal and the input clock signal to generate the modified input signal.

The voltage-current converter may internally generate variable currents according to the control voltage, and output current control voltages to mirror the variable currents in the variable delay cells.

The clock multiplier may further include a charge pump and a loop filter. The charge pump generates a current based on the control signals of the phase-frequency detector. The loop filter generates the control voltage based on the current from the charge pump.

In other exemplary embodiments of the present invention, a clock multiplier includes a phase-frequency detector, a voltage-current converter, a duty ratio control circuit, M variable delay blocks and an edge combiner. The voltage-current converter converts a control voltage to generate first and current control voltages. The control voltage is generated based on control signals of the phase-frequency detector. The duty ratio control circuit controls the duty ratio of an input clock signal based on the first and second current control voltages. Each of the M variable delay blocks includes N variable delay cells. Each of the variable delay cells generates a triangular wave voltage based on the modified input signal, generates a square wave voltage based on the triangular wave voltage to modify the delay of the modified input signal, and modifies again the duty ratio of the modified input signal to generate a delay signal. The triangular wave voltage has a slope corresponding to the first and current control voltages. The delay signal has its duty ratio proportional to the duty ratio of the input clock signal.

Each of the variable delay cells may include a capacitor, and the variable delay cell may charge the capacitor, based on (through a first variable resistance device controlled by) the first current control voltage, while the modified input signal corresponds to a first logic level and discharge based on (through a second variable resistance device controlled by) the second current control voltage while the modified input signal corresponds to a second logic level to generate the triangular wave voltage.

Each of the variable delay cells may further include a hysteresis buffer, and the hysteresis buffer generates the square wave voltage having the first logic level while the triangular wave voltage is greater than a first critical value and generates the square wave voltage having the second logic level while the triangular wave voltage is less than a second critical value.

The square wave voltage may correspond to a delay signal having its duty ratio proportional to the duty ratio of the input clock signal.

Each of the variable delay cells may include a capacitor, a first switch, a pull-up current circuit and a hysteresis buffer. The first switch is turned ON while the modified input signal corresponds to a first logic level. The pull-up current circuit charges the capacitor through a first variable resistance device controlled by the first current while the first switch is turned ON. The hysteresis buffer receives the triangular wave voltage and generates the delayed input clock signal having the first logic level while the triangular wave voltage is greater than a first critical value.

Each of the variable delay cells may further include a second switch, a pull-down current circuit. The second switch is turned ON while the modified input signal corresponds to a second logic level. The pull-down current circuit discharges the capacitor through a second variable resistance device controlled by the second current control voltage while the second switch is turned ON, and the hysteresis buffer receives the triangular wave voltage and generates the delayed input clock signal having the second logic level while the triangular wave voltage is less than a second critical value.

The duty ratio control circuit may generate an internal logic signal based on the first and second current control voltages and configured to perform a logical OR operation upon the input clock signal and the internal logic signal so as to modify the duty ratio of the input clock signal.

The duty ratio control circuit may include a capacitor, and the duty ratio control circuit may charge the capacitor, through a first variable resistance device controlled by the first current control voltage, while the input clock signal corresponds to a first logic level, discharge the capacitor, through a second variable resistance device controlled by the second current control voltage, while the input clock signal corresponds to a second logic level to generate the internal logic signal, and perform a logical OR operation upon the internal logic signal and the input clock signal to generate the modified input signal.

The voltage-current converter may generate a variable current according to the control voltage to provide the variable current to the variable delay cell.

The phase-frequency detector may compare a phase and the frequency based on the input clock signal and a delay signal from a last variable delay cell in Mth variable delay block and generate the control signals based on the result of the comparison.

The phase-frequency detector may compare the phase and frequency of the Lth (L is a natural number from 1 to N) delay signal of K (K is a natural number from 1 to M) variable delay blocks and that of the Lth delay signal of J (J is a natural number different from K, from 1 to M) variable delay blocks, and generate the control signals based on the result of the comparison.

The clock multiplier may further include a charge pump and a loop filter. The charge pump generates a current based on the control signals of the phase-frequency detector. The loop filter generates the control voltage based on the current from the charge pump.

The clock multiplier may further include a multiplexer configured to select one of the multiplied clocks.

In still other exemplary embodiments of the present invention, a clock generator includes a delay locked loop (DLL)-based clock multiplier, a phase locked loop (PLL)-based clock generator and a divider.

The DLL-based clock multiplier multiplies an input clock signal by a multiplication factor P. The PLL-based clock generator multiplies an output signal of the DLL-based clock multiplier by a multiplication factor M to generate a clock signal having a frequency of P×M times the frequency of the input clock signal. The divider divides the clock signal from the PLL-based clock multiplier by the multiplication factor P to generate a clock signal having a frequency of M times the frequency of the input clock signal. The DLL-based clock multiplier includes a phase-frequency detector, a voltage-current converter, a duty ratio control circuit, M variable delay blocks and an edge combiner. The voltage-current converter converts a control voltage to generate first and second current control voltages. The control voltage is generated based on control signals of the phase-frequency detector. The duty ratio control circuit controls the duty ratio of an input clock signal based on the first and current control voltages. Each of the M variable delay blocks includes N variable delay cells. Each of the variable delay cells generates a triangular wave voltage based on the modified input signal and generates a square wave voltage based on the triangular wave voltage to modify the delay of the modified input signal, and configured to modify again the duty ratio of the modified input signal to generate a delay signal. The triangular wave voltage has a slope corresponding to the first and second current control voltages. The delay signal has its duty ratio proportional to the duty ratio of the input clock signal. The edge combiner generates a plurality of multiplied clocks based on the delay signals from each of the variable delay blocks.

Each of the variable delay cells may include a capacitor, and the variable delay cell may charge the capacitor, through a first variable resistance device controlled by the first current control voltage, while the modified input signal corresponds to a first logic level and discharge the capacitor, through a second variable resistance device controlled by the second current control voltage, while the modified input signal corresponds to a second logic level to generate the triangular wave voltage.

Each of the variable delay cells further includes a hysteresis buffer, and the hysteresis buffer generates the square wave voltage having the first logic level while the triangular wave voltage is greater than a first critical value and generates the square wave voltage having the second logic level while the triangular wave voltage is less than a second critical value.

The square wave voltage may correspond to a delay signal having its duty ratio proportional to the duty ratio of the input clock signal.

Each of the variable delay cells may include a capacitor, a first switch, a pull-up current circuit and a hysteresis buffer. The first switch is turned ON while the modified input signal corresponds to a first logic level. The pull-up current circuit charges the capacitor through a first variable resistance device controlled by the first current while the first switch is turned ON. The hysteresis buffer receives the triangular wave voltage and generates the delayed input clock signal having the first logic level while the triangular wave voltage is greater than a first critical value.

Each of the variable delay cells may further include a second switch and a pull-down current circuit. The second switch is turned ON while the modified input signal corresponds to a second logic level. The pull-down current circuit discharges the capacitor through a second variable resistance device controlled by the second current control voltage while the second switch is turned ON. The hysteresis buffer receives the triangular wave voltage and generates the delayed input clock signal having the second logic level while the triangular wave voltage is less than a second critical value.

The duty ratio control circuit may generate an internal logic signal based on the first and second current control voltages and perform a logical OR operation upon the input clock signal and the internal logic signal so as to modify the duty ratio of the input clock signal.

The duty ratio control circuit may include a capacitor, and the duty ratio control circuit may charge the capacitor, through a third variable resistance device controlled by the first current control voltage, while the input clock signal corresponds to a first logic level, discharge the capacitor, through a fourth variable resistance device controlled by the second current control voltage, while the input clock signal corresponds to a second logic level to generate the internal logic signal and perform a logical OR operation upon the internal logic signal and the input clock signal to generate the modified input signal.

The voltage-current converter may generate a variable current according to the control voltage to provide the variable current to the variable delay cell.

The phase-frequency detector may compare the phase and the frequency of the input clock signal and that of a delay signal from a last variable delay cell in Mth variable delay block and generate the control signals based on the result of the comparison.

The phase-frequency detector may compare the phase and frequency of the Lth (L is a natural number from 1 to N) delay signal of K (K is a natural number from 1 to M) variable delay blocks and that of the Lth delay signal of J (J is a natural number different from K from 1 to M) variable delay blocks, and generate the control signals based on the result of the comparison.

The clock generator may further include a charge pump and a loop filter. The charge pump generates a current based on the control signals of the phase-frequency detector. The loop filter generates the control voltage based on the current from the charge pump.

The clock generator may further include a multiplexer configured to select one of the multiplied clocks.

In still other exemplary embodiments of the present invention, a method of multiplying a clock includes generating first and second current control voltages by converting a control voltage being generated based on control signals of a phase-frequency detector; modifying the duty ratio of an input clock signal based on the first and current control voltages to generate a modified input signal; modifying the delay of the modified input signal by generating a triangular wave voltage based on the modified input signal and by generating a square wave voltage based on the triangular wave voltage; generating a plurality of delay signals by modifying again the duty ratio of the modified input signal; and generating a plurality of multiplied clocks based on the delay signals. The triangular wave voltage has a slope corresponding to the first and current control voltages and each of the delay signals has its duty ratio being proportional to the duty ratio of the input clock signal.

Modifying the duty ratio of the input clock signal may include generating an internal logic signal based on the first and second current control voltages; and performing a logical OR operation upon the input clock signal and the internal logic signal so as to modify the duty ratio of the input clock signal.

Generating the triangular wave voltage based on the modified input signal includes charging a capacitor using the first current control voltage while the modified input signal corresponds to a first logic level; and discharging the capacitor using the second current control voltage while the modified input signal corresponds to a second logic level.

Generating the square wave voltage based on the triangular wave voltage may include generating the square wave voltage having the first logic level while the triangular wave voltage is greater than a first critical value; and generating the square wave voltage having the second logic level while the triangular wave voltage is less than a second critical value.

The square wave voltage may correspond to a delay signal having its duty ratio in proportion to the input clock signal.

Therefore, a clock multiplier according to the present invention may efficiently operate in a low frequency region by modifying the delay of an input clock signal.

Also, a clock generator according to the present invention may efficiently operate in a low frequency region by modifying the delay of an input clock signal provided to a clock multiplier based on a delay locked loop.

Embodiments of the present invention now will be described more fully with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout this application.

BRIEF DESCRIPTION OF THE DRAWINGS

The above and other features of the present invention will become more apparent to persons skilled in the art by describing in detail exemplary embodiments thereof with reference to the attached drawings in which.

DETAILED DESCRIPTION OF EXEMPLARY EMBODIMENTS OF THE INVENTION

Figure 1:
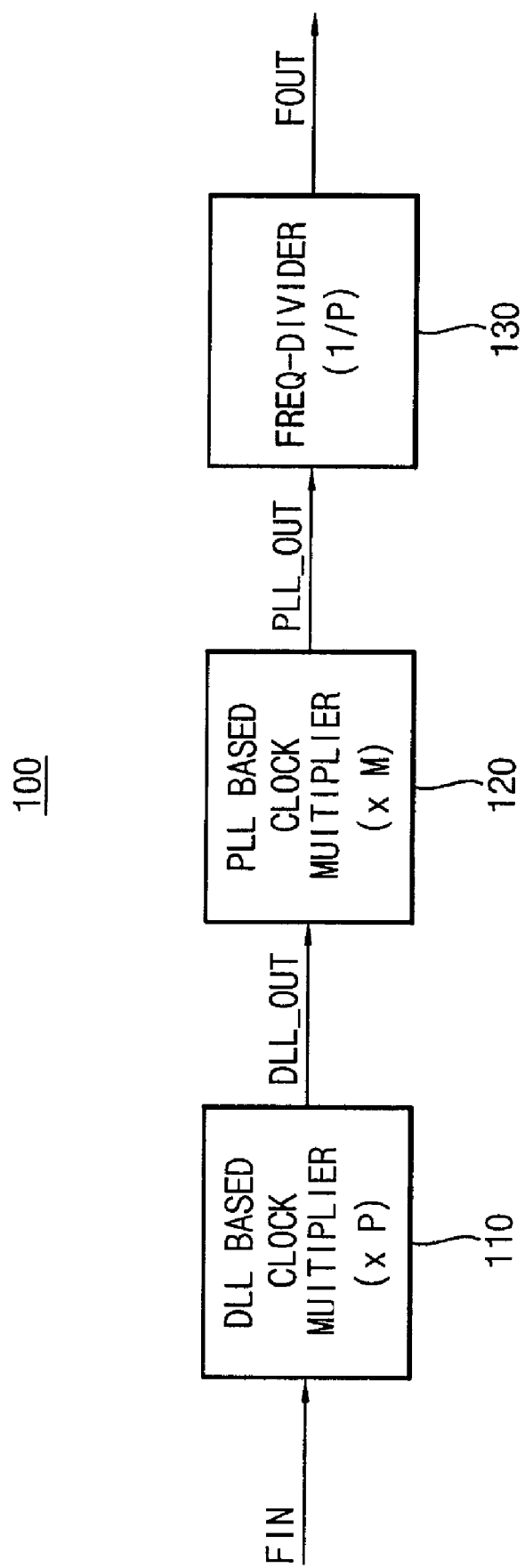
FIG. 1 is a block diagram of a clock generator including a dual loop according to an exemplary embodiment of the present invention.

FIG. 1 is a block diagram of a clock generator including a dual loop according to an exemplary embodiment of the present invention.

Referring to FIG. 1, a clock generator 100 includes a delay locked loop (DLL)-based clock multiplier 110, a phase locked loop (PLL)-based clock multiplier 120 and a divider 130.

The DLL-based clock multiplier 110 multiplies the frequency of an input clock signal FIN by a multiplication factor P. Generally, when the frequency of the input clock signal FIN of the DLL-based clock multiplier 110 is a low frequency of several tens of KHz, an error of the DLL-based clock multiplier 110 may be accumulated. Therefore, the DLL-based clock multiplier 110 multiplies the frequency of the input clock signal FIN by the multiplication factor P to provide a delay locked loop output signal DLL_OUT (FIN×P) to the phase locked loop based clock multiplier 120.

The phase locked loop based clock multiplier 120 multiplies the frequency of the multiplied input signal DLL_OUT by a multiplication factor M to generate a phase locked loop output signal PLL_OUT (FIN×P×M). Therefore, the clock generator 100 may prevent accumulating the error of the phase locked loop based clock multiplier 120 in a low frequency mode of operation.

The divider 130 divides the phase locked loop output signal PLL_OUT by the multiplication factor P of the DLL-based clock multiplier 110 to output an output signal FOUT (FIN× M).

Therefore, the clock generator 100 may generate an output clock having the frequency FIN X M being a target frequency.

Figure 2:
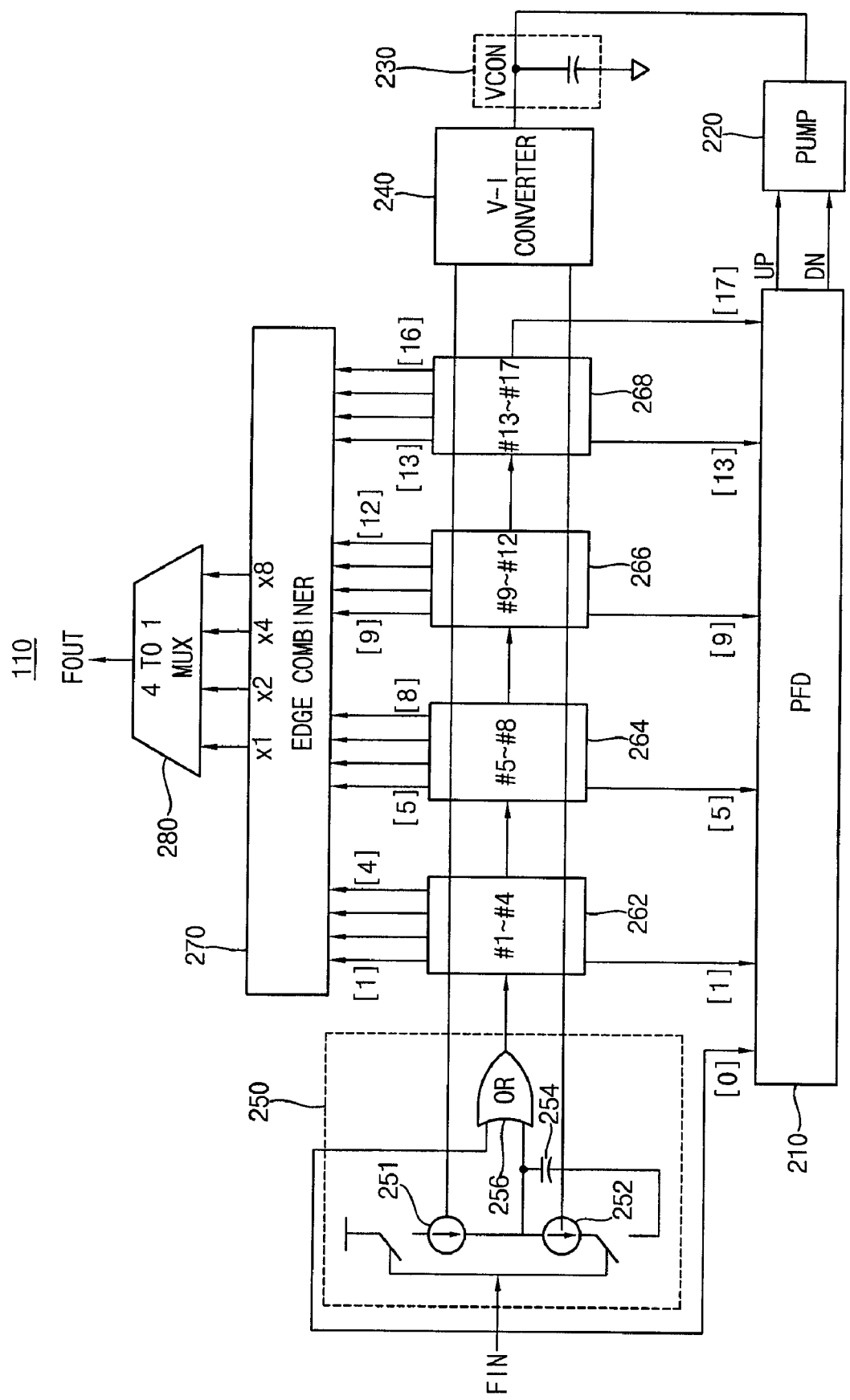
FIG. 2 is a block diagram of a clock multiplier based on a delay locked loop according to an exemplary embodiment of the present invention.

FIG. 2 is a block diagram illustrating a DLL-based clock multiplier according to an exemplary embodiment of the present invention.

Referring to FIG. 2, a DLL-based clock multiplier 110 includes a phase-frequency detector 210, a charge pump 220, a loop filter 230, a voltage-current converter 240, a duty ratio control circuit 250, first through forth variable delay blocks 262, 264, 266 and 268, an edge combiner 270 and a clock selector 280.

The phase-frequency detector 210 receives two clock signals and detects the phase/frequency difference between the two clock signals. When the phase/frequency difference between the two clock signals is detected, the phase frequency-detector 210 generates alternate control signals (for example, UP signal and DN signal) to adjust a control voltage (VCON).

For example, the phase-frequency detector 210 may compare the phase and frequency of the input clock signal FIN with that of a delay signal (delayed input clock signal) outputted from the last variable delay cell in the fourth variable delay block 268, and the phase-frequency detector 210 may generate the control signals based on the result of the comparison. Also, the phase-frequency detector 210 may compare the phase and the frequency of the Lth (L is a natural number from 1 to 4) delay signal among a plurality K of (K is a natural number from 1 to 4) variable delay blocks and that of the Lth delay signal among a plurality J of (J is a natural number different from K, from 1 to 4) variable delay blocks, and the phase-frequency detector 210 may generate the control signals based on the result of the comparison.

The charge pump 220 generates a positive or negative current, for increasing or decreasing the amount of charge stored in the capacitance of the loop filter 230, based on the UP/DN control signals. For example, when the charge pump 220 receives a first control signal (UP), the charge pump 220 may increase the charge stored in the capacitance of the loop filter 230, and when the charge pump 220 receives a second control signal (DN), the charge pump 220 may decrease the charge stored in the capacitance of the loop filter 230.

The loop filter 230 generates the control voltage VCON based on the charge stored in the capacitance of the loop filter 230 which is controlled by the charge pump 220. For example, when the charge pump 220 increases the charge stored in the capacitance of the loop filter 230, the loop filter 230 increases the control voltage VCON, and when the charge pump 220 decrease the charge stored in the capacitance of the loop filter 230, the loop filter 230 decreases the control voltage VCON.

The voltage-current converter 240 converts the control voltage VCON generated based on the control signals (UP, DN) of the phase-frequency detector 210 to generate first and second current control voltages (at current sources 251 and 252). Thus, the voltage-current converter 240 generates the first and second current control voltages used for modifying the duty ratio of the duty ratio control circuit 250 and for generating delay signals of the variable delay blocks 262, 264, 266 and 268 based on the control voltage VCON.

The duty ratio control circuit 250 controls (modifies) the duty ratio of the input signal FIN based on the first and second current control voltages. The duty ratio control circuit 250 includes first and second variable current sources 251 and 252, a capacitor 254 and an OR-gate 256.

The duty ratio control circuit 250 performs a logical OR operation upon the input signal FIN and an internal logic signal generated in the capacitor 254 based on the first and second current control voltages outputted from the voltage-current converter 240 so as to decrease a slope of a triangular wave voltage generated from the variable delay blocks 262, 264, 266 and 268.

For example, when the input signal FIN is at a first logic level, the duty ratio control circuit 250 charges the capacitor 254 based on the first current control voltage. On the other hand, when the input signal FIN is at second logic level, the duty ratio control circuit 250 discharges the capacitor 254 based on the second current control voltage to generate the internal logic signal. The duty ratio control circuit 250 performs the OR operation upon the internal logic signal and the input signal FIN to generate the modified input signal.

Each of the variable delay blocks 262, 264, 266 and 268 includes a plurality of variable delay cells. Each of the variable delay cells generates a triangular wave voltage having a slope corresponding to the first and second current control voltages based on the modified input signal generated by the duty ratio control circuit 250 and generates a square wave voltage based on the triangular wave voltage to modify the delay of the modified input signal. Each of the variable delay cells generates a delay signal having its duty ratio proportional to the duty ratio of the input signal by modifying again the duty ratio of the modified input signal.

The edge combiner 270 generates a plurality of multiplied clocks based on the delay signals outputted from each of the variable delay cells. For example, the edge combiner 270 may generate multiplied clocks by multiplying the input signal FIN by 1, 2, 4 and 8 respectively.

The clock selector 280 selects one of the multiplied clocks outputted from the edge combiner 270 to generate an output clock FOUT.

Therefore, the DLL-based clock multiplier 110 may efficiently operate in a low frequency region by increasing the delay of the input signal FIN.

Hereinafter, the operation of the voltage-current converter 240 and of the variable delay cells in each of the variable delay blocks 262, 264, 266 and 268 will be described with reference to FIGS. 3, 4 and 5.

Figure 3:
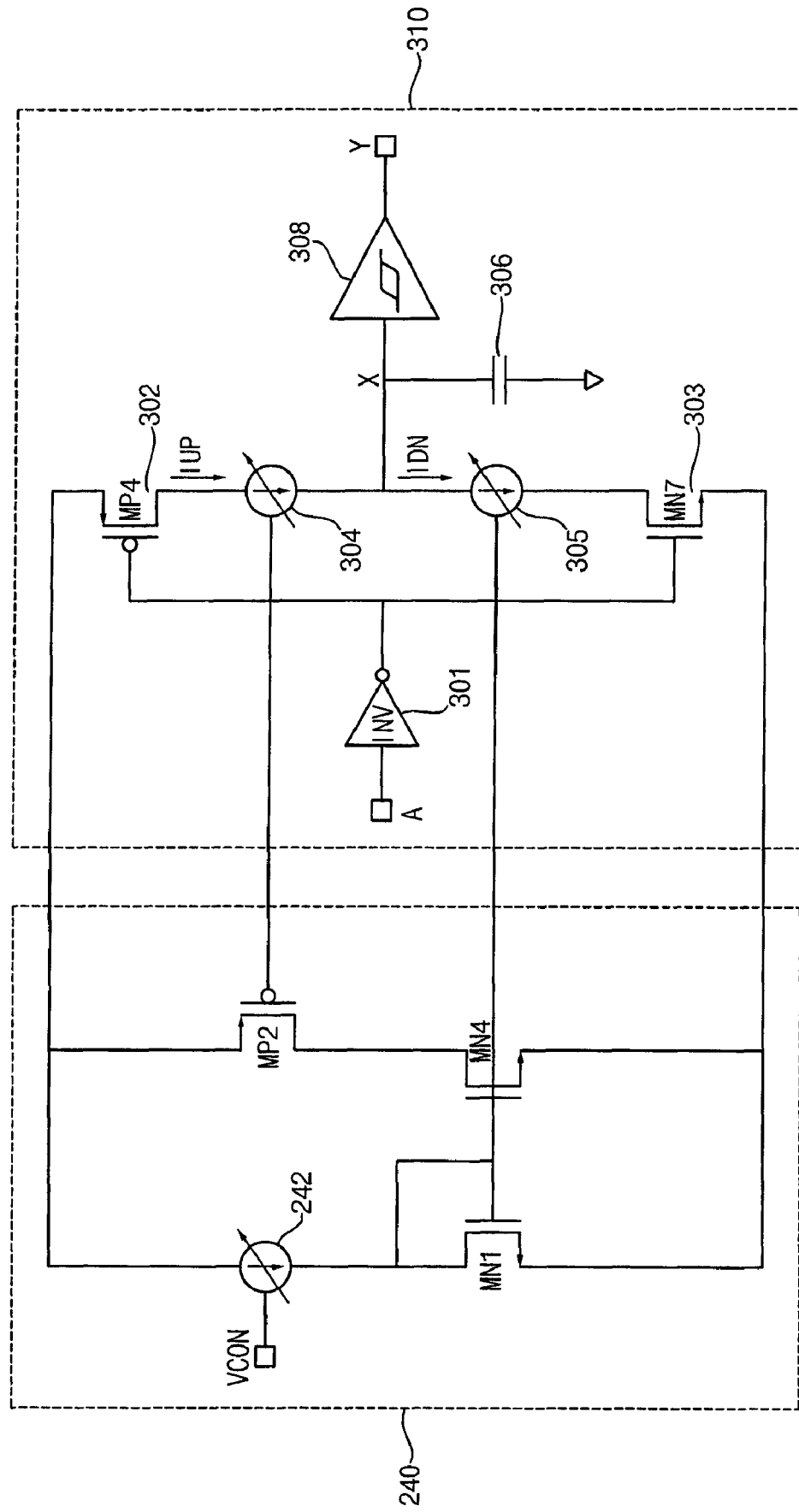
FIG. 3 is a circuit diagram of the voltage-current converter 240 and one variable delay cell 310 for describing operations of the clock multiplier of FIG. 2.
Figure 4:
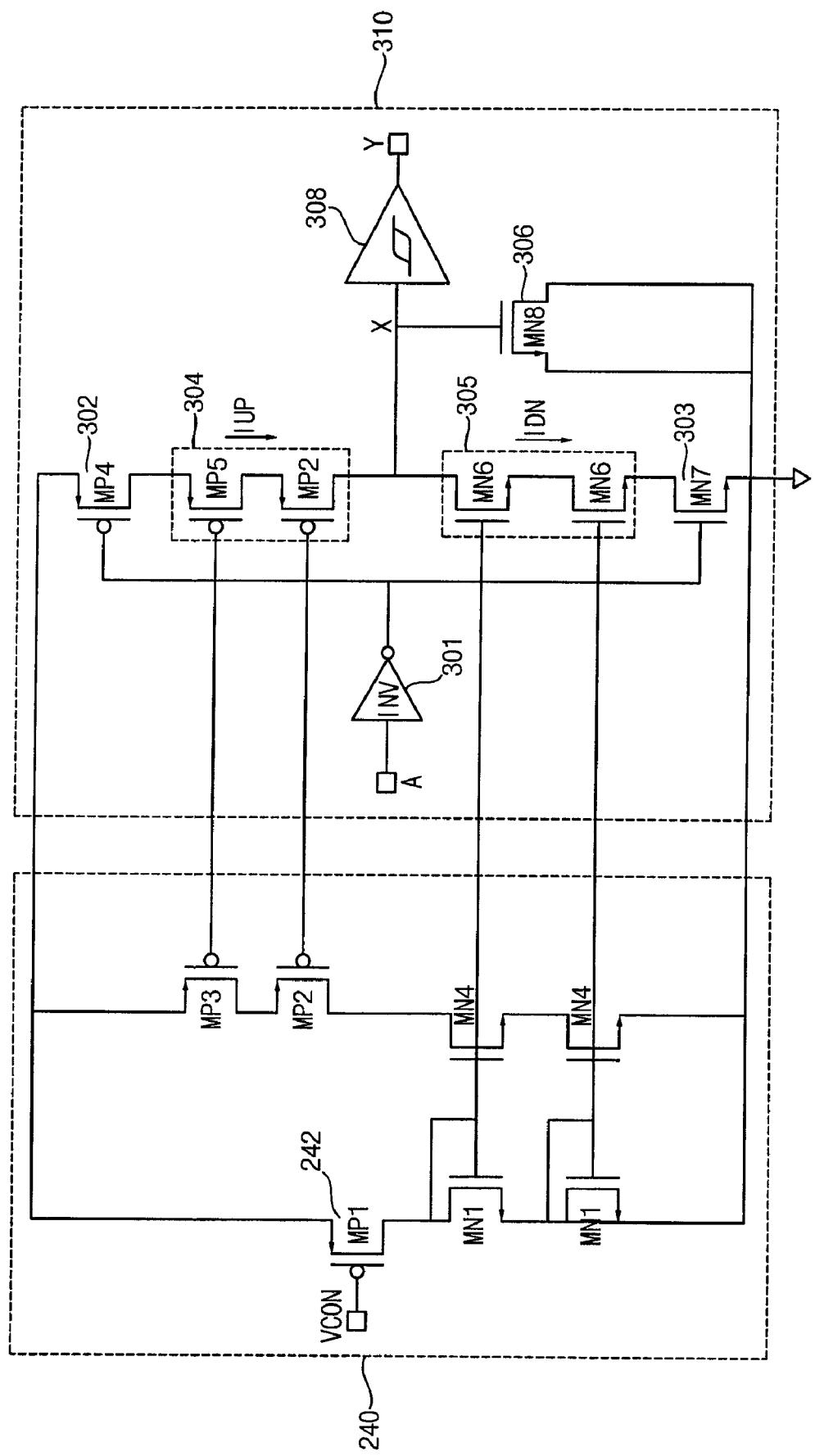
FIG. 4 is a detailed circuit diagram of an exemplary implementation of the voltage-current converter 240 and the variable delay cell 310 of FIG. 3.
Figure 5:
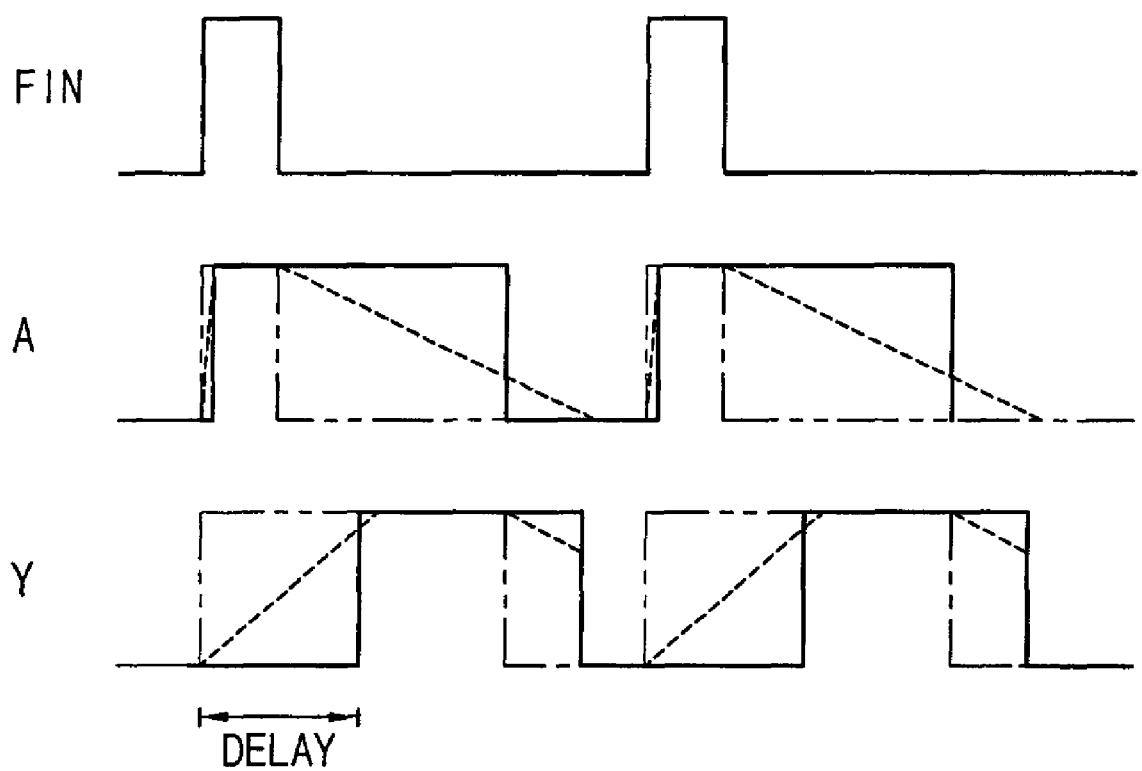
FIG. 5 is a timing diagram illustrating operations of the voltage-current converter 240 and of one variable delay cell 310 in FIG. 4.

FIG. 3 is a circuit diagram of the voltage-current converter 240 and one variable delay cell 310 in FIG. 2, FIG. 4 is a detailed circuit diagram of an exemplary implementation of the voltage-current converter 240 and the variable delay cell in FIG. 3, and FIG. 5 is a timing diagram illustrating operations of the voltage-current converter 240 and the variable delay cell 310 in FIG. 4.

The voltage-current converter 240 generates variable currents (e.g., a variable current through each of transistors MN1, MP2) controlled by the control voltage VCON. The variable currents may be mirrored, via current control voltages transmitted to the variable delay cells 310 to mirror the variable currents of the voltage-current converter 240 in the variable delay cell 310. For example, the voltage-current converter 240 may comprise current mirrors that mirror the variable currents and output current control voltages based on the mirrored currents to mirror the currents to the variable delay cell 310.

The voltage-current converter 240 comprises a voltage controlled current source 242 and a plurality of transistors (MN1, MN2 and MN4) forming a current mirroring circuit. As shown in FIG. 4, each of the transistors MN1, MN2 and MN4 may be implemented as a pair of serially connected transistors.

The variable delay cell 310 may be any one of the plurality of delay cells (#1 through #17) shown in FIG. 2. The variable delay cell 310 includes an inverter 301, first and second switches 302 (e.g., transistor MP4) and 303 (e.g., transistor MN7), a pull-up current circuit 304, a pull-down current circuit 305, a capacitor 306 and a hysteresis buffer 308. The capacitor may be implemented using the gate dielectric of a NMOS transistor MN8.

The variable delay cell 310 generates a triangular wave voltage based on an input signal A and having a slope corresponding to the first and second current control voltages. Input signal A is derived from the input signal FIN modified by the duty ratio control circuit 250 (see FIG. 2). The variable delay cell 310 generates a square wave voltage based on the triangular wave voltage to modify the delay of the modified input signal A. The variable delay cell 310 modifies again the duty ratio of the modified input signal A to output a delay signal Y.

The first switch 302 is turned ON while the modified input signal A is at a first logic level, and the pull-up current circuit 304 charges the capacitor 306 based on the first current control voltage outputted from the voltage-current converter 240 while the first switch 302 is turned ON.

The pull-up current circuit 304 charges the capacitor 306 through a first variable resistance device, the first variable resistance device (MP5) being controlled by a first current control voltage outputted from the voltage-current converter 240. The first variable resistance device (MP5) controls the rate that the capacitor is filled, and thus the slope of rise of the triangular wave voltage at the capacitor. The first variable resistance device may be implemented as one or more serially connected transistors MP5 controlled by one or more first current control voltage outputted from the voltage-current converter 240.

The second switch 303 is turned ON while the modified input signal A is at a second logic level, and the pull-down current circuit 305 discharges the capacitor 306 based on the second current control voltage in the voltage-current converter 240 while the second switch 303 is turned ON.

The pull-down current circuit 305 discharges the capacitor 306 through a second variable resistance device (MN6), the second variable resistance device (MN6) being controlled by a second current control voltage outputted from the voltage-current converter 240. The second variable resistance device (MN6) controls the rate that the capacitor is emptied, and thus the slope of fall of the triangular wave voltage at the capacitor. The second variable resistance device may be implemented as one or more serially connected transistors MN6 controlled by one or more second current control voltage outputted from the voltage-current converter 240.

The voltage-current converter 240 comprises a voltage controlled current source 242 controlled by VCON and a plurality of transistors (MN1, MN2 and MN4) implementing a current mirroring circuit. As shown in FIG. 4, each of the transistors MN1, MN2 and MN4 may be implemented as a pair of serially connected transistors.

The hysteresis buffer 308 receives a triangular wave voltage while the first switch 302 is turned ON and generates a delayed input signal having the first logic level while the triangular wave voltage is greater than a first critical value. Also, the hysteresis buffer 308 receives a triangular wave voltage while the second switch 303 is turned ON and generates a delayed input signal having the second logic level while the triangular wave voltage is less than a second critical value.

The operation of the variable delay cell 310 is described as follows.

The variable delay cell 310 charges the capacitor 306 through the first variable resistance device, the first variable resistance device being controlled by the first current control voltage, while the modified input signal A is at the first logic level. The variable delay cell 310 discharges the capacitor 306 through the second variable resistance device, the second variable resistance device being controlled by the second current control voltage, while the modified input signal A is at the second logic level. The charging and discharging of the capacitor 306 generates the triangular wave voltage at the capacitor 306.

The variable delay cell 310 includes an inverter formed by complementary switches 302 and 303 (transistors MP4 and MN7), a current mirror formed by the n-channel transistors MN1 and MN6, and p-channel transistors MP2 and MP5. The value of a control signal VCON determines the current flow in the p-channel transistor MP1 and thus through transistor MN1, MP2, MN4, MP5 and MN6. At higher values for VCON, the current flow in the p-channel transistor MP5 (or n-channel transistor MN7) is low. As the value of VCON decreases, the current in the p-channel transistor MP5 (or n-channel transistor MN7) increases. A low current value provided by p-channel transistor MP5 limits the value of IUP (through transistor MP5) which is the drain-to-source current of p-channel transistor MP4. As the currents IUP and IDN decrease, the switching speed of the inverter (MP4 and MN7) decreases, thereby adding delay when generating the output signal Y from the input signal A. Therefore, in order to decrease the delay of the input signal A through the variable delay cell 310, the value of control signal VCON is decreased.

Conversely, as the IUP and IDN current values increase, the switching speed of inverter (MP4 and MN7) increases, thereby decreasing the delay when generating the output signal Y from the input signal A. Therefore, in order to decrease the delay of the input signal A through the variable delay cell 310, the value of control signal VCON is increased.

The hysteresis buffer 308 generates a square wave voltage by latching and unlatching the triangular wave voltage. The square wave voltage has the first logic level while the triangular wave voltage is greater than the first critical value and has the second logic level while the triangular wave voltage is less than the second critical value. For example, the first critical value and the second critical value in the hysteresis buffer 308 may be controlled so that the square wave voltage corresponds to a delay signal having its duty ratio proportional to (e.g., proportional to, e.g., equal to, the duty cycle of) the input signal FIN.

Figure 6:
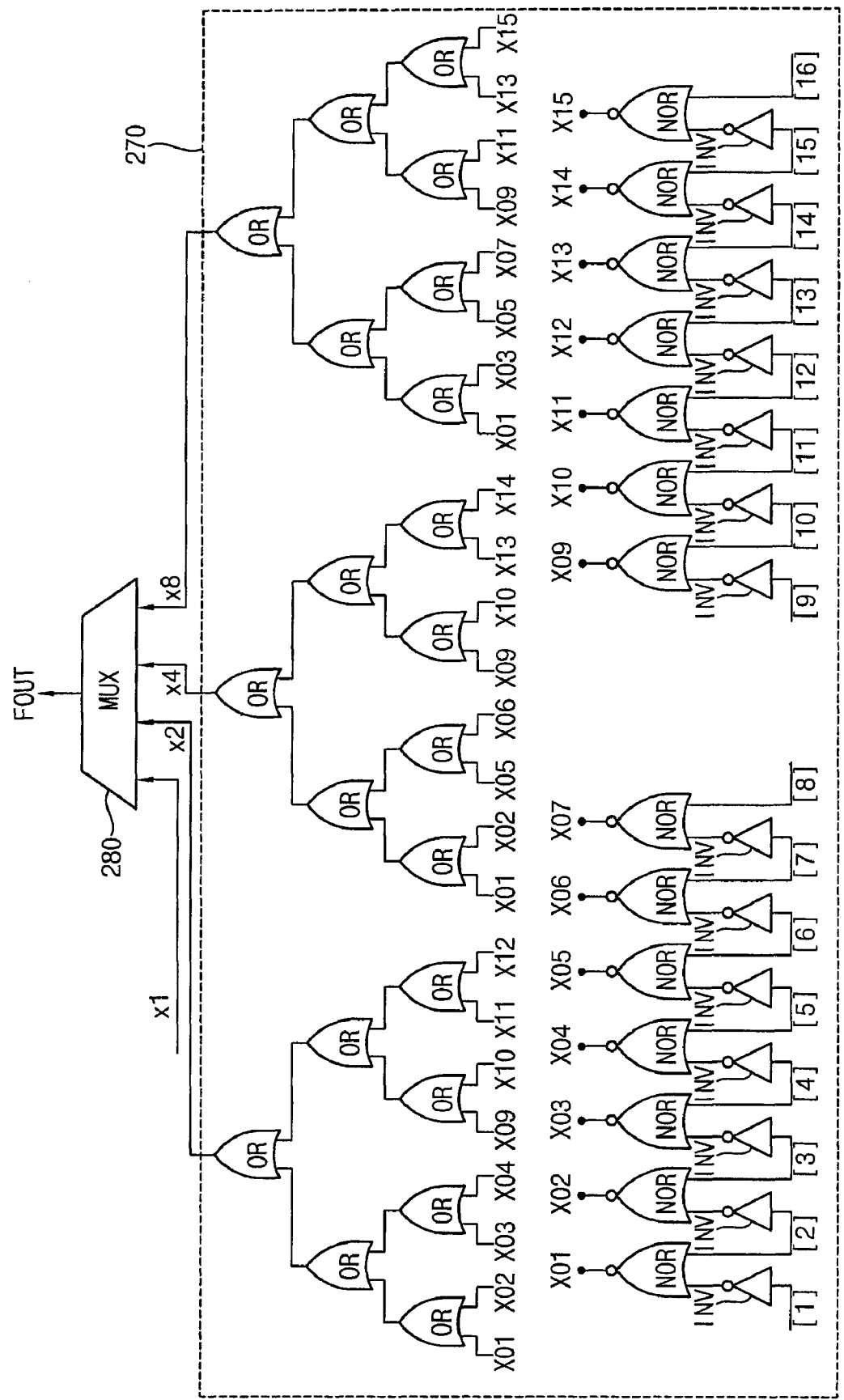
FIG. 6 is a block diagram illustrating a conventional edge combiner employed in the clock multiplier of FIG. 2.

FIG. 6 is a block diagram of the edge combiner 270 in FIG. 2.

Referring to FIG. 6, an edge combiner 270 includes a plurality of OR circuits, a plurality of NOR circuits and inverters.

The edge combiner 270 receives a plurality of delay signals outputted from the variable delay blocks 262, 264, 266 and 268 and generates multiplied clocks by multiplying the input signal FIN by 1, 2, 4, and 8, respectively based on the received delay signals. The operation of the edge combiner 270 is not described because the edge combiner 270 illustrated in FIG. 6 is a conventional edge combiner commonly included by persons skilled in the art in delay locked loops.

As described above, the clock multiplier according to exemplary embodiments of the present invention may efficiently operate in a low frequency region by modifying the delay of an input signal.

Also, the clock generator according to exemplary embodiments of the present invention may efficiently operate in a low frequency region by modifying the delay of an input signal provided to a DLL-based clock multiplier.

Many apparent variations are possible without departing from the spirit or scope of the invention as hereinafter claimed. For example, the serial connection sequence of the transistors MP4 and MP5 may be changed, and/or the serial connection sequence of the transistors MN7 and MN6 may be changed, without significantly affecting the operation of the variable delay cell 310. Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed. In the claims, the symbols P, M, N, L, J, and K represent numbers, and the numbers M, N, L, J and K are natural numbers.

What is claimed is:

1. A clock multiplier comprising:
   a plurality of variable delay cells, each of the variable delay cells configured to generate a triangular wave voltage based on an input clock signal, and configured to generate a square wave voltage based on the triangular wave voltage; and
   a duty ratio control circuit configured to modify the duty ratio of the input clock signal based on control signals output by a phase-frequency detector,
   wherein the duty ratio control circuit includes a capacitor, and the duty ratio control circuit is configured to generate an internal logic signal by charging the capacitor through a third variable resistance device based on the control signals output by the phase-frequency detector while the input clock signal corresponds to a first logic level and by discharging the capacitor through a fourth variable resistance device based on the control signals output by the phase-frequency detector while the input clock signal corresponds to a second logic level, and configured to perform a logical OR operation upon the internal logic signal and the input clock signal.

2. The clock multiplier of claim 1, further comprising a voltage-current converter configured to generate first and second current control voltages based upon the control voltage, the control voltage being generated based on control signals output by the phase-frequency detector.

3. The clock multiplier of claim 2, further comprising an edge combiner configured to generate a plurality of multiplied clocks based on the square wave voltages from the variable delay cells.

4. The clock multiplier of claim 1, wherein each of the variable delay cells is configured to modify the duty ratio of its respective square wave voltage.

5. The clock multiplier of claim 1, wherein the triangular wave voltage in each of the variable delay cells has a rising slope corresponding to a first current control voltage and a falling slope corresponding to a second current control voltage.

6. The clock multiplier of claim 5, wherein each of the variable delay cells includes a capacitor, and the variable delay cell is configured to charge the capacitor, through a first variable resistance device controlled by the first current control voltage, and configured to discharge the capacitor, through a second variable resistance device controlled by the second current control voltage, to generate the triangular wave voltage.

7. The clock multiplier of claim 5, wherein each of the variable delay cells further includes a hysteresis buffer, and the hysteresis buffer is configured to generate the square wave voltage at a first logic level while the triangular wave voltage is greater than a first critical value and configured to generate the square wave voltage at a second logic level while the triangular wave voltage is less than a second critical value.

8. The clock multiplier of claim 7, wherein the square wave voltage corresponds to a delay signal having its duty ratio proportional to the duty ratio of the input clock signal.

9. The clock multiplier of claim 1, wherein each of the variable delay cells comprises: a capacitor; a first switch configured to turn ON while the input of the variable delay cell is at a first logic level; a pull-up current circuit configured to charge the capacitor, through a first variable resistance device controlled based on the control signals output by a phase-frequency detector, while the first switch is turned ON; and a hysteresis buffer configured to receive the triangular wave voltage, and configured to generate the square wave voltage at the first logic level while the triangular wave voltage is greater than a first critical value.

10. The clock multiplier of claim 9, wherein each of the variable delay cells further comprises: a second switch configured to turn ON while the input of the variable delay cell is at a second logic level; and a pull-down current circuit configured to discharge the capacitor, through a second variable resistance device controlled based on the control signals output by the phase-frequency detector, while the second switch is turned ON; and wherein the hysteresis buffer. is configured to receive the triangular wave voltage, and configured to generate the square wave voltage at the second logic level while the triangular wave voltage is less than a second critical value.

11. The clock multiplier of claim 1, further comprising a voltage-current converter configured to convert a control voltage to generate first and second current control voltages, the control voltage being generated based on control signals of a phase-frequency detector; wherein each of the variable delay cells generates a triangular wave voltage based on the first and second current control voltages.

12. The clock multiplier of claim 11, further comprising: a charge pump configured to generate a current based on the control signals of the phase-frequency detector; and a loop filter configured to generate the control voltage based on the current from the charge pump.

13. A clock multiplier comprising:
a plurality of variable delay cells, each of the variable delay cells configured to generate a triangular wave voltage based on an input clock signal, and configured to generate a square wave voltage based on the triangular wave voltage; and
a duty ratio control circuit includes a capacitor, wherein the duty ratio control circuit is configured to generate an internal logic signal by charging and discharging the capacitor based on the input clock signal and control signals output by a phase-frequency detector and configured to modify the duty ratio of the input clock signal based on the internal logic signal.

* * * * *